United States Patent [19]

Waldron

[11] 4,386,293

[45] May 31, 1983

[54] FLAT DISPLAY CELL AND CABLE WITH ELECTRICAL AND MECHANICAL INTERCONNECTION STRUCTURE

[75] Inventor: Wesley K. Waldron, Scotia, N.Y.

[73] Assignee: General Electric Company, Schenectady, N.Y.

[21] Appl. No.: 161,214

[22] Filed: Jun. 19, 1980

[51] Int. Cl.³ .............. H01J 17/49; H01J 61/30; H05K 1/18
[52] U.S. Cl. .................... 313/583; 361/410; 174/50.52; 174/73 R; 350/336
[58] Field of Search ............. 313/51, 220; 361/408, 361/410

[56] References Cited

U.S. PATENT DOCUMENTS

| 3,105,869 | 10/1963 | Branch et al. | 361/408 X |
| 3,749,959 | 7/1973 | Schmersal et al. | 313/220 X |
| 3,868,676 | 2/1975 | Hennessey et al. | 313/49 X |
| 4,039,882 | 8/1977 | Kupsky et al. | 313/217 |
| 4,099,083 | 7/1978 | Barth | 313/217 |

*Primary Examiner*—Palmer C. Demeo
*Attorney, Agent, or Firm*—Geoffrey H. Krauss; James C. Davis, Jr.; Marvin Snyder

[57] ABSTRACT

A display cell has a pair of abutting substrates, each including a non-display portion, which may be of reduced-thickness. A conductor-bearing flat cable abuts upon the surfaces of a gap formed between the substrate non-display portions. Electrode lead conductors are fabricated upon at least one of the substrate portions and are electrically and mechanically connected to associated cable conductors.

12 Claims, 5 Drawing Figures

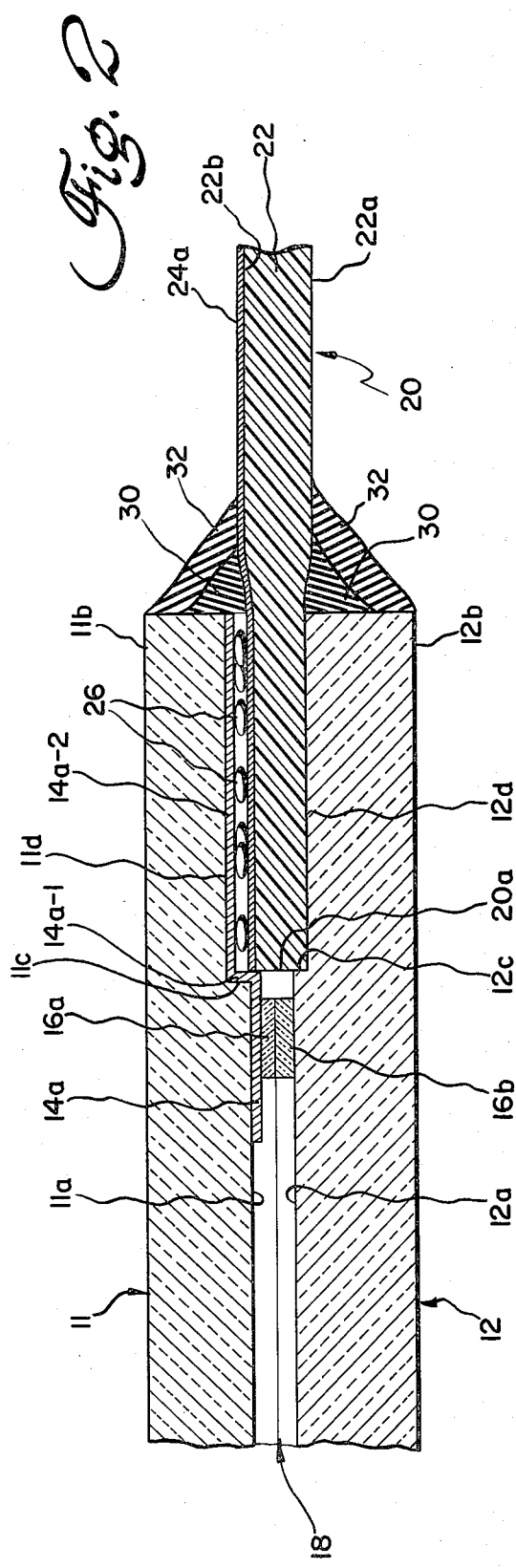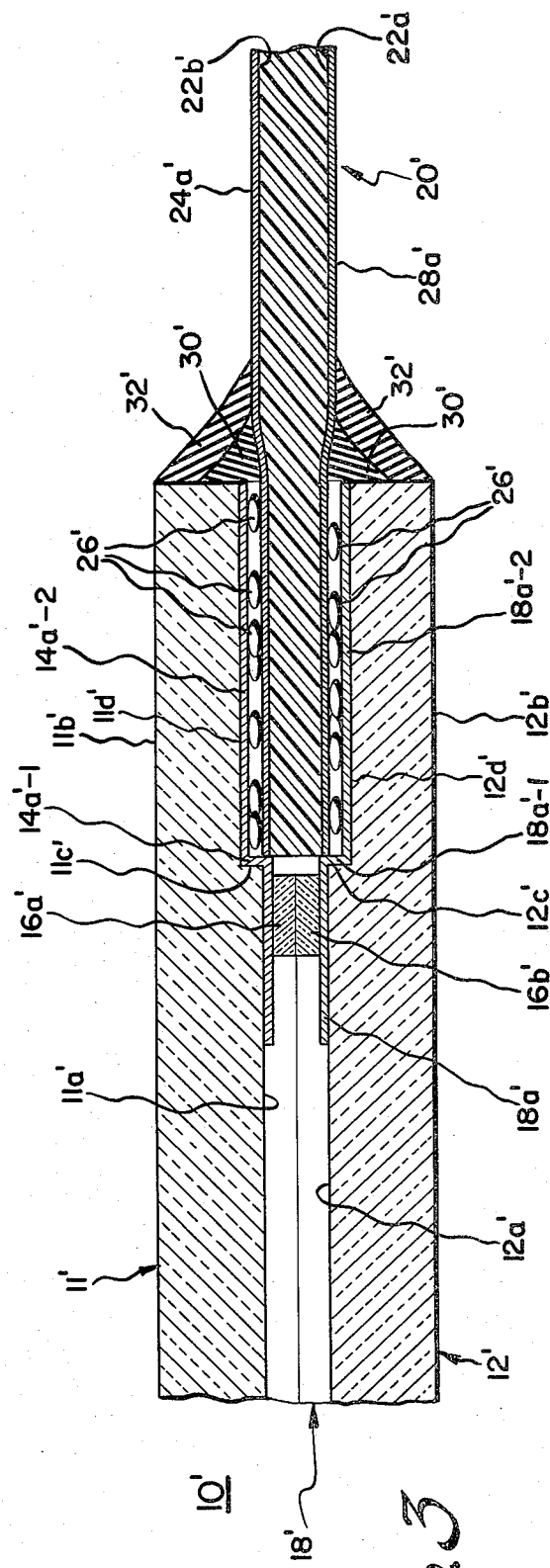

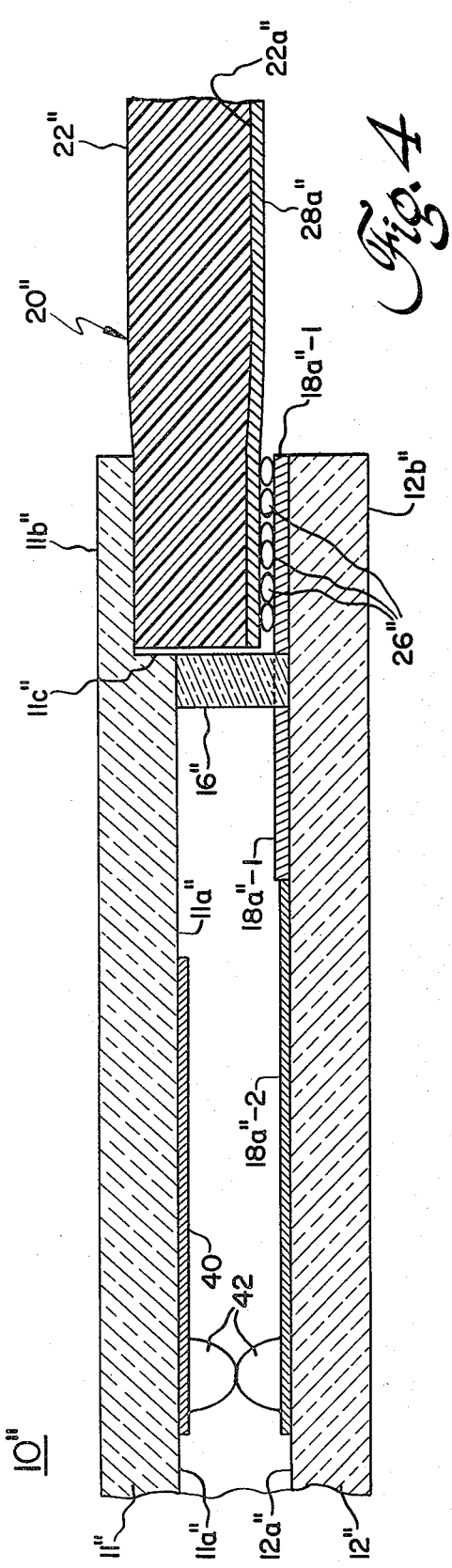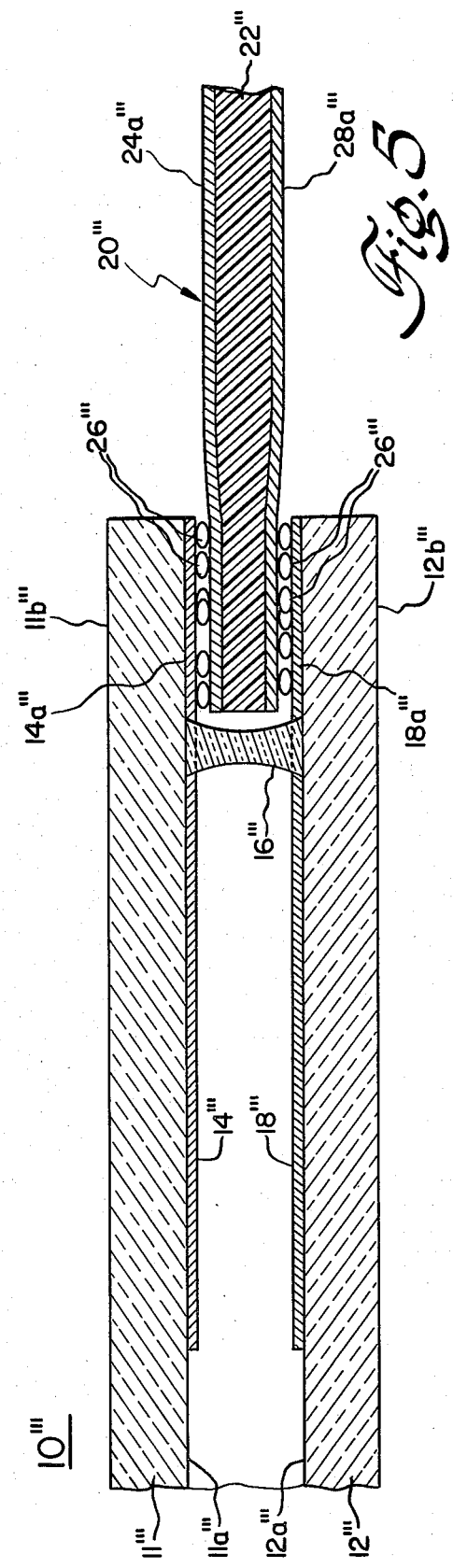

FLAT DISPLAY CELL AND CABLE WITH ELECTRICAL AND MECHANICAL INTERCONNECTION STRUCTURE

BACKGROUND OF THE INVENTION

The present invention relates to apparatus and cable interconnection methods and devices and, more particularly, a novel method for forming contacts between display conductors and conductors in a cable associated with the display, and of the apparatus formed by such methods.

It is often necessary to provide a low-cost, yet highly reliable, electrical contact between a cable conductor and a dielectric-substrate-supported conductive lead. In particular, in electrical displays, utilizing liquid crystals and the like, display electrodes are themselves fabricated as thin films having integral conductive leads which must be reliable contacted by cable conductors carrying energizing signals, from circuitry external to the display, to the display electrode conductors. Hitherto, electrical contacts to substrate-supported thin film conductors were typically achieved by use of pressure contacts between the electrode conductor and the cable conductor, or by the addition of thin film layers of other materials, deposited on top of a portion of the electrode conductor, for providing adequate ohmic contact between the thin film and cable conductors. Each of these two prior art methods are both costly and highly prone to failure during use. A method for providing a reliable, yet low-cost, ohmic contact between a thin film conductor and a cable conductor, which also allows repeated removal of the display-cable assembly from its associated circuitry, is thus highly desirable.

BRIEF SUMMARY OF THE INVENTION

In accordance with the invention, electrodes fabricated upon the interior surface of one or more dielectric substrates, forming front and rear interior surfaces of a display cell, are placed in electrical connection with associated conductors of a cable assembly, by: providing a cable-abutting portion of each of the substrates adjacent to an end thereof and with a gap of predetermined distance therebetween; fabricating conductive lead portions upon the interior-facing surface of at least one of the cable-abutting substrate portions; integrally joining each conductive lead portion to an associated display electrode lead; arranging each of the conductive lead portions to be in registration with an associated conductor of the cable assembly when the cable assembly conductors are placed adjacent to, and in registration with the cable-abutting portion of the substrate; then placing the conductor-bearing cable within the gap between the interior-facing surfaces of the substrate portions; and forming a conductive bond between the registered display electrode conductor portions and the associated cable conductors.

In one presently preferred embodiment, at least one of the substrate abutting portions has a thickness less than the thickness of the remainder of that substrate. Small droplet-shaped elements of a conductor material are placed upon the cable conductors, and/or upon the conductive lead portions fabricated on the substrate portion surface, and are subjected to heat and/or pressure to form an ohmic contact between the substrate conductive lead portion and the cable conductor. Epoxy and/or a fillet of epoxy (or other appropriate material) may be provided adjacent the gap end of the display cell to provide additional integrity and to minimize cable conductor bending stress. Either or both of the substrates may have reduced-thickness portions and either or both of the substrates may have electrode conductive lead portions fabricated thereon. The cable is preferably of a flat configuration, having conductors positioned upon the same number of opposed surfaces as the number of substrates having conductive lead portions upon the interior-facing surfaces of the reduced-thickness abutting portions.

Accordingly, it is an object of the present invention to provide a novel method for forming electrical contacts between conductive films fabricated upon a substrate and associated cable conductors.

It is another object in the present invention to provide a novel display cell-cable assembly wherein display conductive leads each form reliably electrical connections to an associated conductor of a cable permanently attached thereto.

These and other objects of the present invention will become apparent to those skilled in the art upon consideration of the following detailed description, when read in conjunction with the drawings.

BRIEF DESCRIPTION OF THE DRAWINGS

FIG. 2 is a partial sectional view of the substrates and conductor-bearing cable of FIG. 1, after formation of electrical contacts, formed in accordance with the principles of the present invention;

FIG. 3 is a partial sectional view of an alternate embodiment of a cable and a display cell having connections formed therebetween in accordance with the principles of the present invention;

FIG. 4 is a side view of a portion of a generally preferred mass-productible display cell and cable having connections formed therebetween in accordance with the principles of the present invention; and FIG. 5 is a side view of a portion of another display, having substrate spacing sufficiently large as to require no substrate reduced-thickness portion, and of a cable having leads connected to display lead portions in accordance with the principles of the present invention.

DETAILED DESCRIPTION OF THE INVENTION

Figure 1:
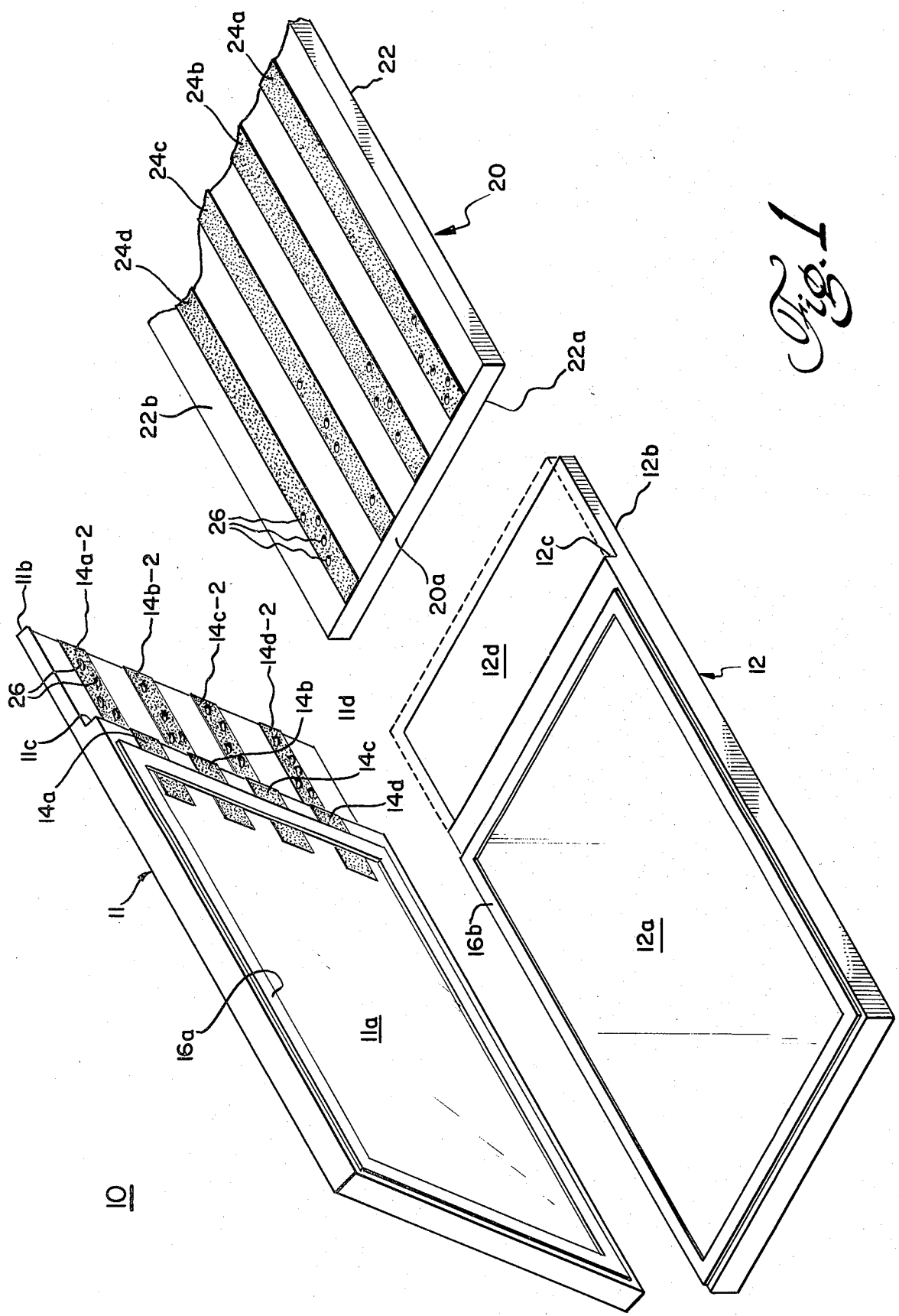
FIG. 1 is an exploded perspective view of a pair of display cell substrates having thin film conductive electrode lead portions formed upon a reduced-thickness portion thereof, and of a flat cable having conductors to be affixed in contact with the conductor portions positioned upon at least one of the substrates.

Referring initially to FIGS. 1 and 2, apparatus 10, such as a liquid crystal, and the like, display cell, comprises a first substrate 11 having a first surface 11a which is one of a pair of interior surfaces of the cell. A second substrate 12 has a surface 12a which is to form the remaining interior surface of the cell. As is well-known in the liquid crystal display arts, substantially transparent and conductive electrodes (not shown) are deposited upon each of the interior surfaces 11a and 12a of substrates 11 and 12, in a pattern commensurate with the desired pattern of indicia to be displayed. Advantageously, the electrodes are fabricated of a thin film of indium oxide, tin oxide, indium tin oxide and the like materials. Attached to each electrode in an associated conductive lead 14, of which four such leads 14a–14d are illustrated in FIG. 1. The leads are integrally fabricated at the same time, and of the same material, as the electrodes and are routed to one or more edges of the display interior surfaces.

Both of the display substrates 11 and 12 contains a non-display portion, 11b or 12b, adjacent to an end thereof, devoid of display electrodes but having conductive lead extensions fabricated upon the interior surfaces 11d and 12d thereof. In the illustrated embodiment, the substrate portions defined by the non-display areas of at least one of surfaces 11d or 12d have reduced substrate thickness, although one or both substrates may have a non-display portion of the same thickness as the remainder thereof, as shown by the normal thickness portion of substrate 12, in broken line. Each of the leads 14 (such as lead 14a as shown in FIG. 2) is integrally extended along a step face 11c, formed between display surfaces 11a or 12a and substrate portion surfaces 11d or 12d, and thence along the interior surface 11d of the reduced-thickness substrate portion 11b, substantially to the end of the substrate. A gap 15 is formed between substrate portion surfaces 11d and 12d. In FIGS. 1 & 2, substrate 11 has a reduced-thickness, electrode-lead-extension-bearing portion 11b. While the remaining substrate 12 need not have a reduced thickness portion, the embodiment of FIGS. 1 and 2 is shown with complimentary-shaped substrate reduced-thickness portions. Second substrate portion 12b, has a step face 12c and a reduced-thickness portion interior surface 12d but does not, here, have electrode lead extensions.

After deposition of the integral electrode-lead formations, including lead portions 14a–14d, integral lead extensions 14a-1 through 14d-1 along substrate step face 11c, and the integral associated extensions 14a-2 through 14d-2 along the reduced-thickness substrate portion surface 11d, a formation 16 of a barrier material, such as glass frit and the like, is deposited upon at least one of substrate interior surfaces 11a and 12a in the shape of a gasket and adjacent to the edges thereof. Gasket material 16 may be equally as well applied to only one surface, e.g. surface 12a as shown in FIG. 1, or may be separate material portions 16a and 16b respectively applied to surfaces 11a and 12a, as shown in FIG. 2. Substrates 11 and 12 are then placed adjacent to one another, with the gasket now extending completely about the display electrode portion of surfaces 11a and 12a and completely between the opposed interior surfaces. Upon further processing, commensurate with the type of material utilized for the gasket, a completely enclosed cavity 18 is formed to contain a liquid crystal material and the like, which may be introduced into cavity 18 through a fill hole (not shown) formed in one of the substrates in manner known to the art.

A substantially flat cable 20 has a pliable dielectric substrate 22, which may be formed of Kapton and the like materials, to which a number, e.g. four, of film conductors 24a–24d adhere. The number of conductors 24 is the same as the number of leads 14a–14d, which have been fabricated on the dielectric substrate 11, and have the same spacing and width as the associated electrode lead portions 14a-2 through 14d-2. Prior to placing substrates 11 and 12 in abutting relationship, flat cable 20 is positioned such that the nonconductor-bearing cable substrate surface 22a abuts against second substrate portion 12b (where the portion 12b may be of normal or reduced thickness). First substrate 11 is now positioned adjacent substrate 12 and also abuts cable 20, which cable is now positioned within gap 15 such that the forward cable end 20a is adjacent to step face 11c and cable conductors 24a through 24d are each in registration with, and adjacent to, the associated one of electrode lead extension conductors 14a-2 to 14d-2. Each cable conductor 24 is electrically connected to the associated electrode lead extension portion 14-2 to complete the cable-to-display cell connection. Advantageously, appropriate shaped elements 26 (which may be "ball" shaped) are placed between the cable conductor, e.g. conductor 24a in FIG. 2, and the associated electrode lead extension, e.g. electrode lead extension 14a-2 in FIG. 2. Elements 26 may be formed of the same material (indium, tin, or indium-tin or similar alloys) utilized for the conductive electrodes 14 and may be initially deposited either upon the cable conductors 24, upon the lead extensions 14 or upon both cable conductor and lead extensions, as desired. After proper positioning of cable 20 and substrates 11 and 12 in registration with each other and with the electrode lead extensions in registration with the cable conductors, suitable means, such as the application of heat and/or pressure, is applied to the cable-substrate assembly to form ohmic contacts between each electrode lead extension portion 14a-2 through 14d-2 and the associated cable conductor 24a through 24d, through elements 26. Dependent upon the material utilized for gasket formation 16, the gasket may be sealed between substrate surfaces 11a and 12a either at the same time, or by subsequent processing steps with the substrates-cable assembly being held clamped by external apparatus (not shown) until a mechanically secure seal between the substrates and the cable is formed. Thus, the metallic bonds between the electrode lead extensions and cable conductors are both mechanically and electrically sound and secured, within the gap between the pair of substrates. Additionally, an epoxy fillet 30 may be deposited to additionally secure cable 20 to substrates 11 and 12, and a fillet 32, of silicone and the like materials, may be added to provide additional cable-cell integrity and minimize conductor stress. It should be apparent that the free end (not shown) of cable 20 may be mechanically and electrically attached to a printed circuit board or to an electrical connector by any known method. Similarly, it should be understood that cable 20 may be relatively short and the connector, attached at the free end thereof, may also be attached to cell 10, by use of epoxy, silicone and the like adhesives, to form an overall plug-in-type cell-connector unit.

Referring now to FIG. 3, in liquid crystal displays especially, it is often required that electrodes be fabricated upon both interior surfaces 11a' and 12a' of the pair of substrates of 11' and 12' utilized for a display cell 10'. Accordingly, electrode leads 14a' and 18a' will extend to an edge of the substrates; both substrates accordingly have integral electrode lead extensions 14a'-1 and 18a'-1 along the respective substrate end faces 11c' and 12c' and integral lead portions 14a'-2 and 18a'-2 fabricated on substrate reduced-thickness portion surfaces 11d' and 12d', respectively. It should be understood that more than one electrode may be present, above and/or below the plane of the drawing, if more than a single electrode connection is required upon each substrate surface. It should be further understood that only one of the substrates need have a reduced-thickness portion, although both substrates 11' and 12' are illustrated as having reduced-thickness portions 11b' and 12b', respectively. Therefore, in the illustrated embodiment of FIG. 3, each substrate has an associated step face 11c' and 12c', upon which an integral portion 14a'-1 and 18a'-1 extend between their associated electrode conductors 14a' and 18a' and the associated electrode lead extensions 14a'-2 and 18a'-2. Cable 20' now includes at least one conductor 24a' upon the surface 22b' and at least one conductor 28a upon the remaining surface 22a'. The conductors upon the opposed surfaces of the cable insulator may have elements 26' predeposited thereon, or elements 26' may be predeposited upon conductor portions 14a'-2 and 18a'-2 or upon both the conductive extensions and cable conductor portions. Cable 20' is positioned within the gap between the substrate portions and the conductors on the opposite surfaces of the cable aligned in registration with the conductor portions upon the substrates. Heat and/or pressure, and the like, is applied to form mechanically sound and electrically conductive bonds between the registered cable conductors and substrate conductor leads. Gasket portions 16a' and 16b' are joined together to form the cell-surrounding gasket. Additional stress-reducing and connector-integrity-elements including epoxy deposits 32' and silicone fillets 32', and the like, may be utilized, as described hereinabove with respect to the embodiment of FIGS. 1 and 2.

Referring now to FIG. 4, a presently preferred embodiment of mass-producible liquid crystal display cell 10″ uses opposed substrates 11″ and 12″, having the facing interior surfaces 11a″ and 12″, respectively, supporting electrodes 40 and 18a″-1, respectively. Because of the present difficulty in providing conductors, in low cost manner, along the step-face of a substrate reduced-thickness portion, the conductor lead extensions, e.g. lead extensions 18a″-1, are placed on the interior surface 12a″ of a substrate 12″ which is of substantially constant thickness. The remaining substrate 11″ has a reduced-thickness portion 11b″, with a cable-receiving gap formed bewtween substrate portions 11b″ and 12b″. To facilitate use of electrodes on both substrate interior surfaces, crossover formations 42, as known to the art, may be used, e.g. to connect electrode 40, on substrate surface 11a″, to an associated lead 18a″-2 on the remaining substrate surface 12a″. Cell-surrounding gasket 16″ is fabricated over the conductive leads. Cable 20″ has registered conductor portions, e.g. portion 28a″, fabricated only on that surface, e.g. surface 22a″, of the insulator adjacent to the conductive-lead-portion-carrying substrate surface, e.g. surface 12a″. Elements 26″ may be used, as may fillets and other bending-stream-relieving elements, as previously described hereinabove.

Referring now to FIG. 5, a display cell 10‴ may be of design such that the distance between the interior-facing surfaces 11a‴ and 12a‴ of respective substrates 11‴ and 12‴, is slightly greater than the thickness of cable 20‴. In such case, electrodes and/or leads 14‴ and 18‴ are utilizable upon both substrate surfaces. The need for substrate reduced-thickness portions is alleviated, as portions 11b‴ and 12b‴ are already a sufficient distance apart to form a cable-end-receiving gap therebetween. Cable 20‴ may have conductors 24‴ on one side and conductors 28‴ on the other, to contact associated and registered cell lead portions 14a‴ and 18a‴, respectively. Other considerations remain as discussed hereinabove.

There have just been described a method for forming and, apparatus utilizing, electrical contacts between cable conductors and device conductor films, which provides a reliable contact therebetween with high mechanical integrity, while being suitable for low-cost continuous processing of the devices, such as liquid crystal display and the like.

While several preferred embodiments of my novel method and apparatus have been described in detail herein, many variations and modifications will now become apparent to those skilled in art. It is my intent, therefore, to be limited only by the scope of the open pending claims and not by the specific details presented herein.

What is claimed is:

1. In combination, a display cell comprising first and second insulative substrates each having an interior surface facing one another, the interior surface of each of said first and second substrates having a display portion and another portion; at least one conductive lead fabricated upon at least a portion of the interior surface display portion of at least one of said substrates and integrally extending as a conductive lead extension upon the interior surface of said another substrate portion thereof; said another portions of said substrates having a gap therebetween when the interior surfaces of said substrates are placed in registration with each other; a cable comprising an insulative substrate having a pair of opposed surfaces and an end; at least one conductor fabricated upon at least one of the cable substrate surfaces, with each of said cable conductors positioned to be in registration with an associated one of said conductive lead extensions when said cable substrate end is positioned within and substantially fills said gap formed between said another portions of said substrates; and conductive elements deposited upon at least one of the conductive lead extensions and the cable conductors; said conductive elements being positioned only between, and electrically and mechanically connecting, each portion of said cable conductors within said gap and an associated and registered conductive lead extension.

2. The combination of claim 1, wherein a plurality of conductive leads are present upon the interior surface of said first substrate display portion and are integrally joined to a like number of associated conductive lead extensions upon the said interior surface of said first substrate another portion; said cable having a like number of conductors placed upon an associated one of said pair of opposed surfaces, with spacings and widths substantially identical to the spacings and widths of said substrate conductor lead extensions.

3. The combination of claim 2 wherein said first substrate another portion is of reduced thickness with respect to the thickness of the display portion of said first substrate.

4. The combination of claim 3 wherein said second substrate has at least one conductive lead fabricated upon said interior surface of the display portion thereof, and a like number of conductive lead extensions are fabricated upon the interior surface of said second substrate another portion and each integrally connected to an associated one of said one conductive leads; said cable having a like number of additional conductors positioned upon the remaining one of said opposed pair of surfaces with each of said additional conductors having a position and size preselected to position said additional conductors each in registration with an associated one of said of least one conductive lead extensions fabricated upon said interior surface of said second substrate another portion; each of at least one conductive lead extensions and the associated one of the additional conductors being electrically and mechanically connected together.

5. The combination of claim 4, wherein said second substrate another portion is of reduced thickness with respect to the display portion of said second substrate.

6. The combination of claim 3, wherein said second substrate another portion is of reduced thickness with respect to the display portion of said second substrate.

7. The combination of claim 2, wherein said second substrate another portion is of reduced thickness with respect to the display portion of said second substrate.

8. The combination of claim 1, wherein said elements are ball-shaped elements.

9. The combination of claim 8, wherein the ball-shaped elements are fabricated of a material selected from the group consisting of indium, tin and an indium-tin alloy.

10. The combination of claim 9, wherein said conductive lead extensions are fabricated of a material selected from the group consisting of indium oxide, tin oxide, and indium-tin oxide.

11. The combination of claim 1, further comprising means for relieving stress on the cable at the point at which said cable exits from said gap between said display cell substrates.

12. The combination of claim 11, wherein said stress relieving means includes a fillet of epoxy material deposited between said substrates and said cable, adjacent to said display cell gap.

* * * * *